United States Patent [19]
Chisholm et al.

[11] Patent Number: 5,420,445
[45] Date of Patent: May 30, 1995

[54] ALUMINUM-MASKED AND RADIANTLY-ANNEALED GROUP II-IV DIFFUSED REGION

[75] Inventors: Michael F. Chisholm, Plano; David I. Forehand, Wylie, both of Tex.

[73] Assignee: Texas Instruments Incorporated, Dallas, Tex.

[21] Appl. No.: 20,519

[22] Filed: Feb. 22, 1993

[51] Int. Cl.$^6$ .................. H01L 29/18; H01L 29/22; H01L 31/0272; H01L 31/0296
[52] U.S. Cl. ........................................ 257/78; 257/42; 257/201; 257/441; 257/442; 257/614
[58] Field of Search .................. 437/111, 155, 3, 5, 437/173; 257/42, 201, 441, 442, 614, 78

[56] References Cited

U.S. PATENT DOCUMENTS

| | | | |
|---|---|---|---|
| 4,568,397 | 2/1986 | Hoke et al. | 148/175 |
| 4,634,474 | 1/1987 | Camlibel et al. | 148/1.5 |

FOREIGN PATENT DOCUMENTS

| | | | |
|---|---|---|---|
| 57-23279 | 2/1982 | Japan | 257/442 |
| 62-90986 | 4/1987 | Japan . | |

Primary Examiner—Andrew J. James
Assistant Examiner—Alice W. Tang
Attorney, Agent, or Firm—René E. Grossman; Richard L. Donaldson

[57] ABSTRACT

Only the areas of the CdTe/HgCdTe interface of a FPA detector circuit which is coupled by an epoxy to a silicon-based integrated circuit that require interdiffusing are heated to a sufficiently high temperature or have photons of light impinging thereon for a sufficient time to cause interdiffusion of the two layers by the travel of tellurium into the HgCdTe and the travel of mercury into the CdTe. The vast majority of the wafer is masked with an aluminum thin film to greatly reduce heat gain or photon transmission. An advantage of the process in accordance with the present invention is that only a very small fraction of the HgCdTe/epoxy/silicon-based integrated circuit wafer receives incoming energy during interdiffusion whereby problems caused by the differences in coefficient of thermal expansion between silicon and HgCdTe at the epoxy interface are minimized.

12 Claims, 1 Drawing Sheet

ALUMINUM-MASKED AND RADIANTLY-ANNEALED GROUP II-IV DIFFUSED REGION

BACKGROUND OF THE INVENTION

1. Field of the Invention

This invention relates to passivation of group II-VI semiconductor materials and particularly to the passivation of mercury cadmium telluride (HgCdTe).

2. Brief Description of the Prior Art

Passivation of HgCdTe in accordance with the prior art included cleaning of the surface thereof, then passivating with a chemical solution and then depositing a material over the passivated surface. A problem encountered is that some of the passivating materials used are not suitable for an infrared detector, some contribute background noises and some are not mechanically or chemically stable and there are also problems with radiation hardness of the devices. Cadmium telluride (CdTe) has generally been used as the passivating material in the prior art. The CdTe is deposited on the HgCdTe which has a thickness of about 20 to 30 mils and is heated to about 300° C. The mercury then diffuses into the CdTe and the cadmium diffuses into the HgCdTe to provide a graded rather than definite interface. It is believed that this passivation reduces 1/f noise from the HgCdTe surface.

In the fabrication of high quality, low noise photodiodes in HgCdTe, it is necessary to properly passivate the surface of the HgCdTe. It has been shown that CdTe passivated HgCdTe produces low noise, low leakage diodes in thick (>10 mil) HgCdTe when the CdTe is interdiffused by annealing the CdTe/HgCdTe samples at 300 ⓡ to 400° C. for up to several hours.

The above noted procedure operates well on the thick HgCdTe samples because the samples do not require mounting to or support by any other structures. They can be annealed as self entities by conventional methods as set forth hereinabove. This forgoes any thermal mismatch with other materials (i.e., no coefficient of thermal expansion mismatches). When thin samples are used which cannot be autonomous there are stresses induced in the HgCdTe which cause dislocations, slip lines, microcracks and fractures in the material. Defects in the HgCdTe severely degrade device performance. This problem is even more severe in the fabrication process used to fabricate FPAs because vertically integrated photodiodes are mounted to silicon wafers by the use of low outgassing epoxys. Since the devices are operated at 77° K, they must be compatible with the process at these temperatures. The interdiffusion anneals can require temperatures at high as about 675° K (about 400° C.). These epoxys are made to be used in limited temperature ranges which do not normally see 600° K excursions. The interdiffused CdTe/HgCdTe is required to produce low noise IRFPA detectors. This problem occurs at about 180° C. However, since a temperature of about 250° to 300° C. is required for the interdiffusion to take place, it follows that the 300° C. passivation temperatures cannot be tolerated in the fabrication of detector system of the prior art as discussed above which utilize an epoxy. The high temperature anneals cause the epoxy to cure and harden. One theory is that the glass transition temperature (Tg) shifts up and the epoxy locks in at higher temperature on cooldown from the anneal. When cooling to device operating temperatures (77° K), the stresses induced due to the coefficient of thermal expansion mismatch are increased even more than normal. These stresses have been shown to cause catastrophic damage to the HgCdTe. According to a second theory, since it is known that the stress induced by thermal mismatch must be greater than the yield stress of the HgCdTe for damage to occur, as the HgCdTe-epoxy-silicon stack is heated, the thermal mismatch between HgCdTe and silicon increases while the yield stress for HgCdTe decreases. This would also be a cause of severe damage of the type noted above. These two factors can cause HgCdTe damage when cooled back down to room temperature.

SUMMARY OF THE INVENTION

The present invention solves the problem of interdiffusing a CdTe/HgCdTe interface of a thin (5 to 10 microns) HgCdTe substrate epoxy mounted to a silicon-based integrated circuit wafer without causing the formation of cracks or slip-lines or other defects in the HgCdTe substrate that would degrade the optical and/or electrical performance of IRFPA detectors.

In accordance with one embodiment of the present invention, a very large portion of the silicon-based integrated circuit wafer is maintained relatively cool by selectively interdiffusing the CdTe/HgCdTe interface in at least the area around the N-P diode junction. This is accomplished by masking the other regions with a highly reflective material of preferably lower emissivity than HgCdTe, preferably aluminum, and irradiating the entire surface with a light source which provides light energy which interacts with and is absorbed by the material which requires annealing but does not heat up the epoxy due to reflection from the highly reflective material. By using materials that have largely differing emissivities for certain radiant energies (different wavelengths), the energy input to the selected area is selectively controlled, the light source preferably being a quartz halogen lamp. Since the CdTe and HgCdTe have a much higher emissivity than that of aluminum, the energy absorbed by the CdTe and HgCdTe is much larger than the energy absorbed by the aluminum. This results in the non-masked CdTe/HgCdTe interface reaching temperatures high enough to cause interdiffusion while the temperature of the masked regions is maintained sufficiently low so as not to cause any of the HgCdTe defects mentioned hereinabove.

In accordance with a second theory of operation, a portion of the silicon-based integrated circuit wafer is masked by a non-photon-transmitting film, preferably a metal, such as aluminum, to selectively interdiffuse the CdTe/HgCdTe interface in at least the area around the N-P diode junction. The wafer temperature is of no concern as long as it is maintained below about 180° C. The wafer temperature can be controlled in any standard manner and can be as low as, for example, standard room temperature.

In accordance with the first theory of operation of the present invention, only the general areas of the CdTe/HgCdTe interface that require interdiffusing require heating to a sufficiently high temperature to cause interdiffusion. Of course, heating to some extent outside of this area can take place without being detrimental. The vast majority of the wafer is masked with an aluminum thin film to greatly reduce heat gain and therefore maintain much lower average temperature in the HgCdTe/epoxy/silicon-based integrated circuit structure. An advantage of the process in accordance with the first theory of operation of the present invention is that only a very small fraction of the HgCdTe/epoxy/silicon-based integrated circuit wafer need be heated up to maintain the overall temperature of the wafer relatively lower to minimize the deleterious effects noted above.

In accordance with the second theory of operation of the present invention, only the general areas of the CdTe/HgCdTe interface that require interdiffusing are exposed to photons at sufficiently high flux to cause interdiffusion at the CdTe/HgCdTe interface within an economically appropriate manufacturing time period. Of course, photon exposure to some extent outside of this area can take place without being detrimental. The wafer is masked with a non-photon-transmitting film, such as aluminum thin film, to reduce heat gain and therefore maintain much lower average temperature in the HgCdTe/epoxy/silicon-based integrated circuit structure. The mask can cover the entire wafer with the exception of the HgCdTe bars or it can also cover non-diode bearing portions of the HgCdTe bars in addition. An advantage of the process in accordance with the second theory of operation of the present invention is that only a very small fraction of the HgCdTe/epoxy/silicon-based integrated circuit wafer need be exposed to photon flux to avoid the deleterious effects noted above.

DESCRIPTION OF THE PREFERRED EMBODIMENT

Figure 1:
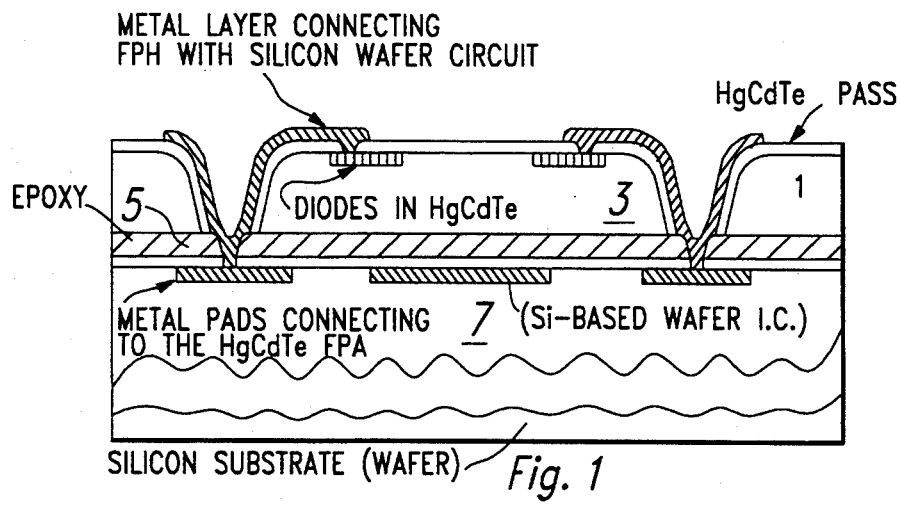
FIG. 1 is a diagram of the elements for fabrication of an infrared focal plane array in accordance with the present invention.

Referring first to FIG. 1 there is shown a structure 1 fabricated to provide an infrared focal plane array. The structure 1 includes a HgCdTe focal plane array detector circuit 3 in accordance with the present invention which is secured by an epoxy 5 to a silicon-based wafer 7 containing an integrated circuit therein in standard manner.

Figure 2A:
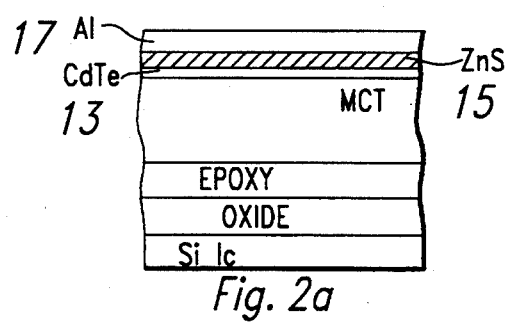
FIGS. 2a through 2c are a process flow for providing an interdiffused region in accordance with the present invention.
Figure 2B:
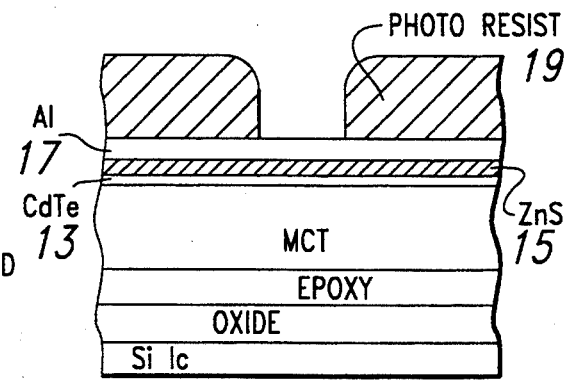
Figure 2C:
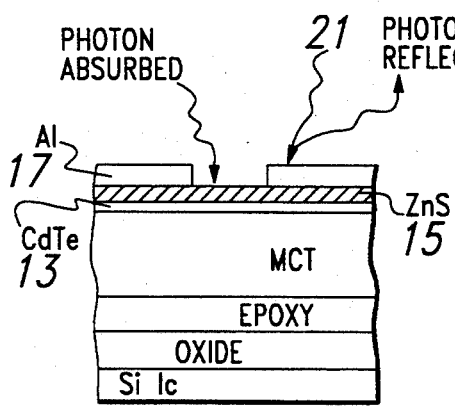

Referring now to FIGS. 2a to 2c, there is shown a process flow for fabrication of the HgCdTe focal plane array detector circuit 3 of FIG. 1. Initially, there is provided a wafer of HgCdTe 11 with a passivating layer of CdTe 13 disposed thereover in standard manner, for instance by evaporation. Any group II-VI material with a higher band gap than HgCdTe can be used in place of the CdTe. The thickness of the CdTe layer 13 is from about 100 angstroms to about 2000 angstroms and preferably about 600 angstroms, the upper limit of the thickness of this layer depending also upon the amount of heat or photon flux involved. An optional layer of zinc sulfide (ZnS) 15 (this is used for environmental purposes only) having a thickness of about 1000 angstroms, this thickness not being critical, is then deposited, preferably by metalorganic chemical vapor deposition (MOCVD), followed by a layer of aluminum 17 which is preferably sputtered over the ZnS as shown in FIG. 2a. The ZnS layer can be replaced with any material with a band gap higher than the passivation layer material on the HgCdTe, this being CdTe 13 in the above example. The ZnS layer 15 prevents interaction between the aluminum and the cadmium telluride. A layer of photoresist 19 is then spun onto the surface of the aluminum layer 17 and patterned to expose the aluminum in the regions where interdiffusion is to take place, this being by heating according to the first embodiment and theory of operation as shown in FIG. 2b or by photon enhancement according to the second embodiment and theory of operation. The exposed aluminum 17 is then etched away with a standard aluminum etchant, such as chlorine or bromine, and the remaining photoresist is removed to provide the structure of FIG. 2c.

According to the first and second embodiments and theories of operation, a heat source or light source, preferably a quartz halogen lamp, is directed toward the surface of the detector circuit 3 whereby the heat or light energy 21 impinging upon the aluminum layer 17 is reflected therefrom and not absorbed. The amount heat flux in the heat producing embodiment striking the wafer is about 1 to 2 watts/cm$^2$ and the amount of light in the light producing embodiment is sufficient to cause interdiffusion at the interface in an economically reasonable time period. The open regions wherein the aluminum has been removed allows interdiffusion at the interface of the CdTe 13 and the HgCdTe 11 due to energy absorption of the radiation 21 (either heat or light) from the quartz halogen lamp. Device fabrication in the annealed HgCdTe now takes place in the interdiffused regions without the requirement of high temperatures which affect the epoxy or causes the problems above noted.

Though the invention has been described with respect to a preferred embodiment thereof, many variations and modification will immediately become apparent to those skilled in the art. It is therefore the intention that the appended claims be interpreted as broadly as possible in view of the prior art to include all such variations and modifications.

We claim:

1. A semiconductor device comprising:
   (a) a group II-VI semiconductor wafer having a surface;
   (b) a passivating layer disposed over said surface of said wafer to form an interface with said wafer, said passivating layer having an exposed surface opposed to said interface;
   (c) one of a heat energy reflecting layer or a non-photon-transmitting layer masking a predetermined portion of said exposed surface of said passivating layer, the remainder of said exposed surface being an unmasked region; and
   (d) a region of interdiffusion of said group II-VI semiconductor wafer and said passivating layer disposed only at said interface of said semiconductor wafer and said passivating layer in said unmasked region.

2. The device of claim 1 wherein said passivating layer is CdTe.

3. The device of claim 1 further including a layer of zinc sulfide over said passivating layer.

4. The device of claim 1 wherein said passivating layer is a group II-VI compound having a band gap greater than that of HgCdTe.

5. The device of claim 1 further including a silicon-based wafer containing an integrated circuit secured to said group II-VI semiconductor wafer.

6. The device of claim 1 wherein said masking layer is a layer of aluminum.

7. The device of claim 1 wherein said group II-VI semiconductor wafer is HgCdTe.

8. The device of claim 6 wherein said passivating layer is CdTe.

9. The device of claim 7 wherein said passivating layer is CdTe.

10. The device of claim 7 wherein said masking layer is a layer of aluminum.

11. The device of claim 10 wherein said passivating layer is CdTe.

12. The device of claim 11 further including a layer of zinc sulfide over said passivating layer.

* * * * *